US008985716B2

(12) United States Patent
Lundrigan et al.

(10) Patent No.: US 8,985,716 B2
(45) Date of Patent: Mar. 24, 2015

(54) CONSOLE MODULE AND MODULAR CONSOLE SYSTEM

(71) Applicant: Evans Consoles Corporation, Calgary Alberta (CA)

(72) Inventors: Shannon Lundrigan, Calgary (CA); Matko Papic, Calgary (CA); Richard Game, Calgary (CA); Nick Yaskiw, Calgary (CA); Paul Lewis, Calgary (CA)

(73) Assignee: Evans Consoles Corporation, Calgary, Alberta (CA)

( * ) Notice: Subject to any disclaimer, the term of this patent is extended or adjusted under 35 U.S.C. 154(b) by 0 days.

(21) Appl. No.: 13/670,701

(22) Filed: Nov. 7, 2012

(65) Prior Publication Data

US 2014/0124468 A1    May 8, 2014

(51) Int. Cl.
*A47G 29/00* (2006.01)
*A47B 81/00* (2006.01)
(Continued)

(52) U.S. Cl.
CPC ............ *A47B 47/03* (2013.01); *A47B 87/0284* (2013.01); *H05K 7/186* (2013.01);
(Continued)

(58) Field of Classification Search
CPC ......... H05K 7/18; H05K 7/183; H05K 7/186; H01Q 2201/02; H01Q 2201/04; H01Q 2201/10; H01Q 1/02; H01Q 1/025; H01Q 1/04; H01Q 1/08; H01Q 1/14; A47B 47/00; A47B 47/0025; A47B 47/0058; A47B 47/0091; A47B 47/027; A47B 47/021; A47B 87/0207; A47B 87/0215; A47B 87/0223; A47B 87/0284; A47B 87/0276; A47B 87/02; A47B 13/06; A47B 17/003; A47B 21/00; A47B 83/001; A47B 96/1466; A47B 47/0008; A47B 47/05; A47B 47/02; A47B 47/028; A47B 47/03; A47B 47/0016; A47B 47/045; A47F 5/0846; A47F 5/103; A47F 5/10; F16B 12/40; F16B 12/02; F16B 12/10; F16B 12/00; F16B 12/28; F16B 12/32; F16B 12/38; H02B 1/01; H02B 1/014; H02B 1/32; H02B 1/34; H02B 1/301; H02B 1/52
USPC .................. 211/26, 189, 182, 194, 188, 191; 312/265.1–265.4, 223.1
See application file for complete search history.

(56) References Cited

U.S. PATENT DOCUMENTS 5,269,112 A * 12/1993 Weinrub et al. ................. 52/646
5,330,058 A *  7/1994 Rice ................................. 211/4
(Continued)

OTHER PUBLICATIONS

Candian Office Action for Patent Application No. 2,798,731.

*Primary Examiner* — Jennifer E Novosad
(74) *Attorney, Agent, or Firm* — Notaro, Michalos & Zaccaria P.C.

(57) ABSTRACT

The present invention relates to console modules and modular console systems. In one aspect, a console module unit is provided comprising a frame, the frame comprising first and second spaced apart frame sections, each frame section comprising two spaced apart side supports and two spaced apart lateral supports, each lateral support disposed between and forming junctions with corresponding ends of the side supports, and a plurality of cross supports interconnecting the first and second frame sections, wherein at least one of the side, lateral, and cross supports is in the form of an extrusion, the extrusion defining at least one re-entrant channel extending in a direction of its longitudinal axis, the at least one re-entrant channel for receiving at least a portion of a coupler. In another aspect, a modular console system comprising at least two console modules is provided.

17 Claims, 17 Drawing Sheets

(51) Int. Cl.

| | | |
|---|---|---|
| A47B 47/03 | (2006.01) | |
| A47B 87/02 | (2006.01) | |
| H05K 7/18 | (2006.01) | |
| H02B 1/01 | (2006.01) | |
| A47B 47/00 | (2006.01) | |
| A47B 47/04 | (2006.01) | |
| H02B 1/30 | (2006.01) | |
| A47B 47/02 | (2006.01) | |

(52) U.S. Cl.
CPC ........... *H02B 1/014* (2013.01); *A47B 47/0058* (2013.01); *A47B 47/045* (2013.01); *H02B 1/301* (2013.01); *A47B 47/028* (2013.01)
USPC ........ 312/265.3; 312/223.1; 211/26; 211/189

(56) References Cited

U.S. PATENT DOCUMENTS

| | | | |
|---|---|---|---|
| 5,470,139 A * | 11/1995 | Hsiao | 312/140 |
| 5,609,402 A * | 3/1997 | Kemp | 312/265.4 |
| 5,848,500 A * | 12/1998 | Kirk | 52/79.1 |
| 5,938,302 A * | 8/1999 | Anderson et al. | 312/223.1 |
| 6,044,990 A * | 4/2000 | Palmeri | 211/189 |
| 6,102,219 A * | 8/2000 | Wang | 211/194 |
| 6,142,324 A * | 11/2000 | Huang | 211/188 |
| 6,655,532 B1 * | 12/2003 | Kitanaka et al. | 211/26 |
| 6,688,712 B2 * | 2/2004 | Adams et al. | 312/265.1 |
| 7,204,377 B2 * | 4/2007 | Marion | 211/194 |
| 7,438,195 B2 * | 10/2008 | Beck | 211/194 |
| 7,997,213 B1 * | 8/2011 | Gauthier et al. | 108/55.1 |
| 8,076,574 B2 * | 12/2011 | Irmer et al. | 174/50 |
| 8,172,098 B2 * | 5/2012 | Eustace et al. | 211/191 |
| 8,231,185 B1 * | 7/2012 | Trusty | 312/6 |
| 8,434,631 B2 * | 5/2013 | Harpole | 211/195 |
| 2002/0017839 A1 * | 2/2002 | Wei | 312/265.1 |
| 2006/0138066 A1 * | 6/2006 | Hung et al. | 211/189 |
| 2007/0257585 A1 * | 11/2007 | Kenny et al. | 312/265.4 |
| 2010/0006528 A1 * | 1/2010 | Wang | 211/182 |
| 2010/0213803 A1 * | 8/2010 | Schell et al. | 312/326 |
| 2010/0308703 A1 * | 12/2010 | Schell et al. | 312/265.1 |
| 2012/0187814 A1 * | 7/2012 | Fryling | 312/265.1 |
| 2012/0229007 A1 * | 9/2012 | Fan et al. | 312/223.1 |

* cited by examiner

FIG. 9A  FIG. 9B

CONSOLE MODULE AND MODULAR CONSOLE SYSTEM

FIELD OF THE DISCLOSURE

The present disclosure relates to frameworks and structures for supporting equipment or other objects, and in particular to console modules, modular console systems, and accessories therefor.

BACKGROUND

In general, many existing technical furniture and consoles have been custom manufactured, which in terms of design and construction is both expensive and time consuming. This approach has been necessitated by customer requirements that are often unique in terms of work station size, equipment placement, human engineering and cost considerations. In the result, the completed console structures are not only extremely expensive, but are also difficult if not impossible to subsequently modify for the reconfiguration of existing equipment or to retrofit new equipment.

More specifically, existing systems do not provide a low-cost solution that allows for a high degree of customization in terms of size, shape and layout of the console. In many instances, end users desire a console having custom physical dimensions and features. For example, a user may desire a console that is customized to fit a particular room layout. The room could have a curved or sloped wall, one or more support pillars, a multi-level floor, etc. In another example, a user may desire that the configuration of the console be tailored for a specific application, or to hold and support specific equipment. Many existing furniture systems and console systems come in one or a number of standard sizes and shapes in an attempt to provide a "best fit". However, such systems are generally not easily customizable in terms of size and/or shape.

An alternative approach has been to construct the consoles by connecting fixed size modular sections together in an end to end fashion. In some instances, this approach can reduce costs. However, the degree of customization achievable is typically limited since there are usually only a few types of fixed size modules to choose from. Furthermore, there may be some loss of flexibility with respect to subsequent modifications and reconfigurations of equipment within the console.

A further drawback of many existing technical furniture systems and console systems is that it is difficult if not impractical to perform modifications or upgrades to the furniture once it has been manufactured and/or installed. For example, it may be desirable to replace a desktop work surface of an installed console with an equipment cabinet. Such a modification is typically very difficult if not impractical in a custom-built console since the console is likely not constructed of modular sections. It may be possible to perform such a modification in a console made of modular sections. However, the modification will likely be time consuming and may affect portions of the console that are adjacent to the area being modified. For example, it may be necessary to disassemble or reposition adjacent modular sections of the console in order to add or remove another section. Thus changes and reconfigurations can require significant modifications to the existing structure at a substantial financial cost and with significant disruption to the facility.

For at least the foregoing reasons, it can be appreciated that a need exists for a low cost, modular console system. It can be further appreciated that a need exists for a low cost scalable console system. There is also a need for a console system comprising one or more customizable console modules.

SUMMARY

In one aspect, the present disclosure provides a console module unit comprising a self-supporting frame, the frame comprising first and second spaced apart frame sections, each frame section comprising two spaced apart side supports and two spaced apart lateral supports, each lateral support disposed between and forming junctions with corresponding ends of the side supports, and a plurality of cross supports interconnecting the first and second frame sections, wherein there is at least one cross support extending between and joining each of the corresponding junctions of the first and second frame sections, the plurality of cross supports and the first and second frame sections forming the self-supporting frame, wherein at least one of the side, lateral, and cross supports is in the form of an extrusion, the extrusion defining at least one re-entrant channel extending in a direction of its longitudinal axis, the at least one re-entrant channel for receiving at least a portion of a coupler.

In another aspect, the present disclosure provides a modular console system comprising at least a first console module unit and a second console module unit, the first and second console module units each comprising a self-supporting frame, the frame comprising first and second spaced apart frame sections, each frame section comprising two spaced apart side supports and two spaced apart lateral supports, each lateral support disposed between and forming junctions with corresponding ends of the side supports, and a plurality of cross supports interconnecting the first and second frame sections, wherein there is at least one cross support extending between and joining each of the corresponding junctions of the first and second frame sections, the plurality of cross supports and the first and second frame sections forming the self-supporting frame, wherein the frame of the first console module unit is coupleable to the frame of the second console module unit by substantially aligning at least one support of the first console module unit with and adjacent to at least one support of the second console module unit, and connecting the at least one support of the first console module unit to the at least one support of the second console module unit by way of one or more couplers.

In another aspect, the present disclosure provides a console module unit comprising: a self-supporting frame, the frame comprising: first and second spaced apart frame sections, each frame section comprising two spaced apart side supports and two spaced apart lateral supports, each lateral support disposed between and forming junctions with corresponding ends of the side supports; a plurality of cross supports interconnecting the first and second frame sections; a pair of secondary side supports disposed outwardly and spaced away from a corresponding pair of side supports of the frame sections, and each being joined to its corresponding side support by way of one or more connectors, wherein the plurality of cross supports, the first and second frame sections, the pair of secondary side supports, and the connectors form the self-supporting frame.

In another aspect, the present disclosure provides a modular console system comprising: at least a first console module unit and a second console module unit, the first and second console module units each comprising: a self-supporting frame, the frame comprising: first and second spaced apart frame sections, each frame section comprising two spaced apart side supports and two spaced apart lateral supports, each lateral support disposed between and forming junctions with corresponding ends of the side supports; a plurality of cross supports interconnecting the first and second frame sections; and a pair of secondary side supports disposed outwardly and spaced away from a corresponding pair of side supports of the frame sections, and each being joined to its corresponding side support by way of one or more connectors, wherein the plurality of cross supports, the first and second frame sections, the pair of secondary side supports, and the connectors form the self-supporting frame, wherein the frame of the first console module unit is coupleable to the frame of the second console module unit by substantially aligning at least one support of the first console module unit with and adjacent to at least one support of the second console module unit, and connecting the at least one support of the first console module unit to the at least one support of the second console module unit by way of one or more couplers.

BRIEF DESCRIPTION OF THE DRAWINGS

The present disclosure will be better understood having regard to the drawings in which:

FIG. 9A is a side view of one embodiment of a console module having at least one slat wall coupled thereto;

FIG. 9B is a side view of another embodiment of a console module having at least one slat wall coupled thereto;

DETAILED DESCRIPTION

Various aspects and features of the present scheme are now described with reference to the Figures.

Figure 1:
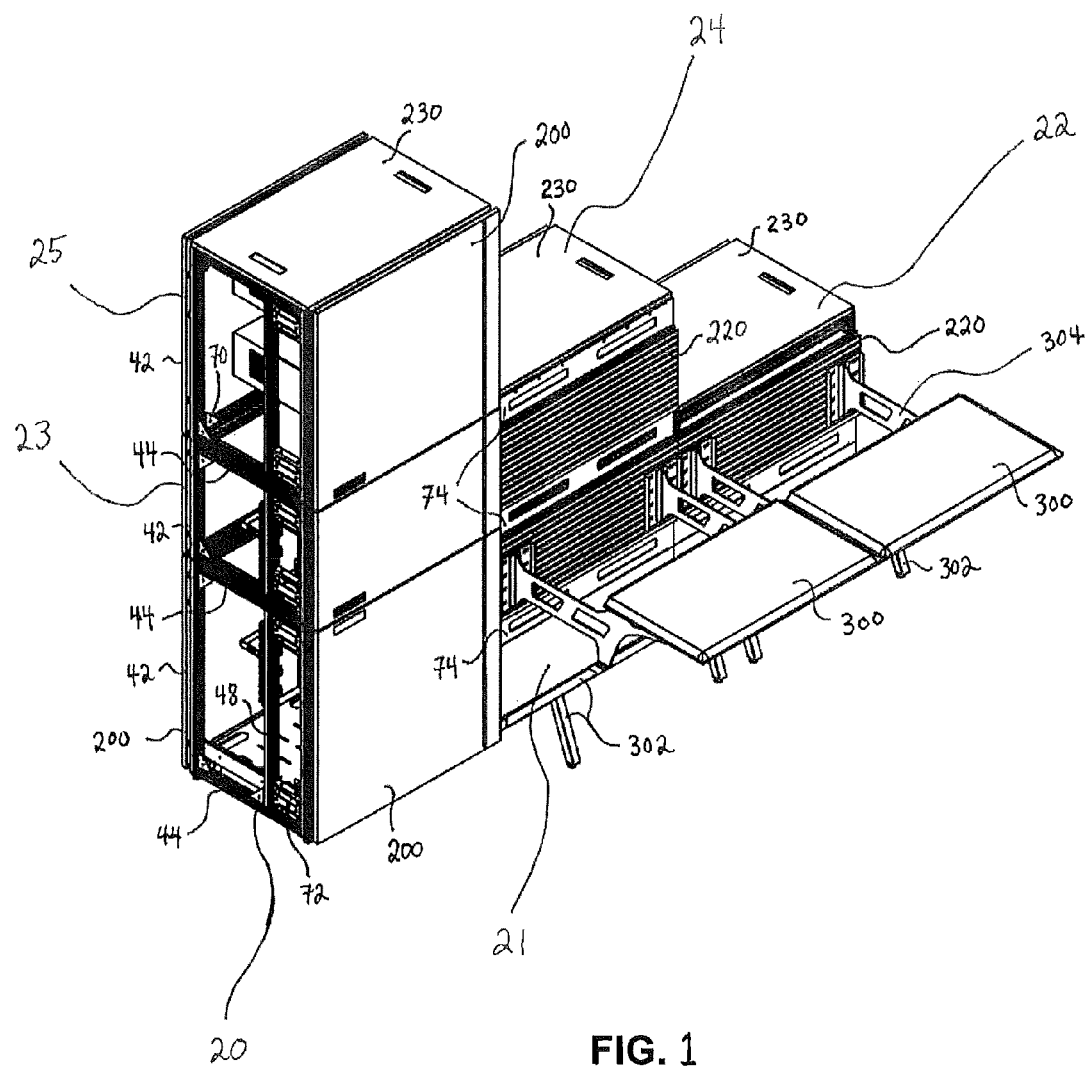
FIG. 1 is a perspective view of an example embodiment of a console system comprising a plurality of console modules.

FIG. 1 shows an example composition and arrangement of console modules 20, 21, 22, 23, 24, 25 of the present console system. The console modules may sometimes be referred to herein as console module units. The console modules are positioned proximate to one another to form a console. For example, modules 23 and 25 are stacked on top of module 20, whereas modules 20, 21 and 22 are positioned side by side. The present console system allows any number of console modules to be arranged in any desired configuration. For example, consoles may be arranged side by side, one in front of another, and one on top of another. Furthermore, adjacent consoles need not necessarily be positioned in perfect alignment with one another.

Frame

Each console module has a frame, and may also comprise equipment supporting hardware internally and/or externally to the frame. A console module may also comprise one or more panels, such as panels 200, 230 shown in FIG. 1, for partially or fully closing off one of the sides thereof. In addition, a console module may be fastened to one or more adjacent modules in order to retain it in position relative to the one or more adjacent modules. These components and features are further described below.

Figure 2A:
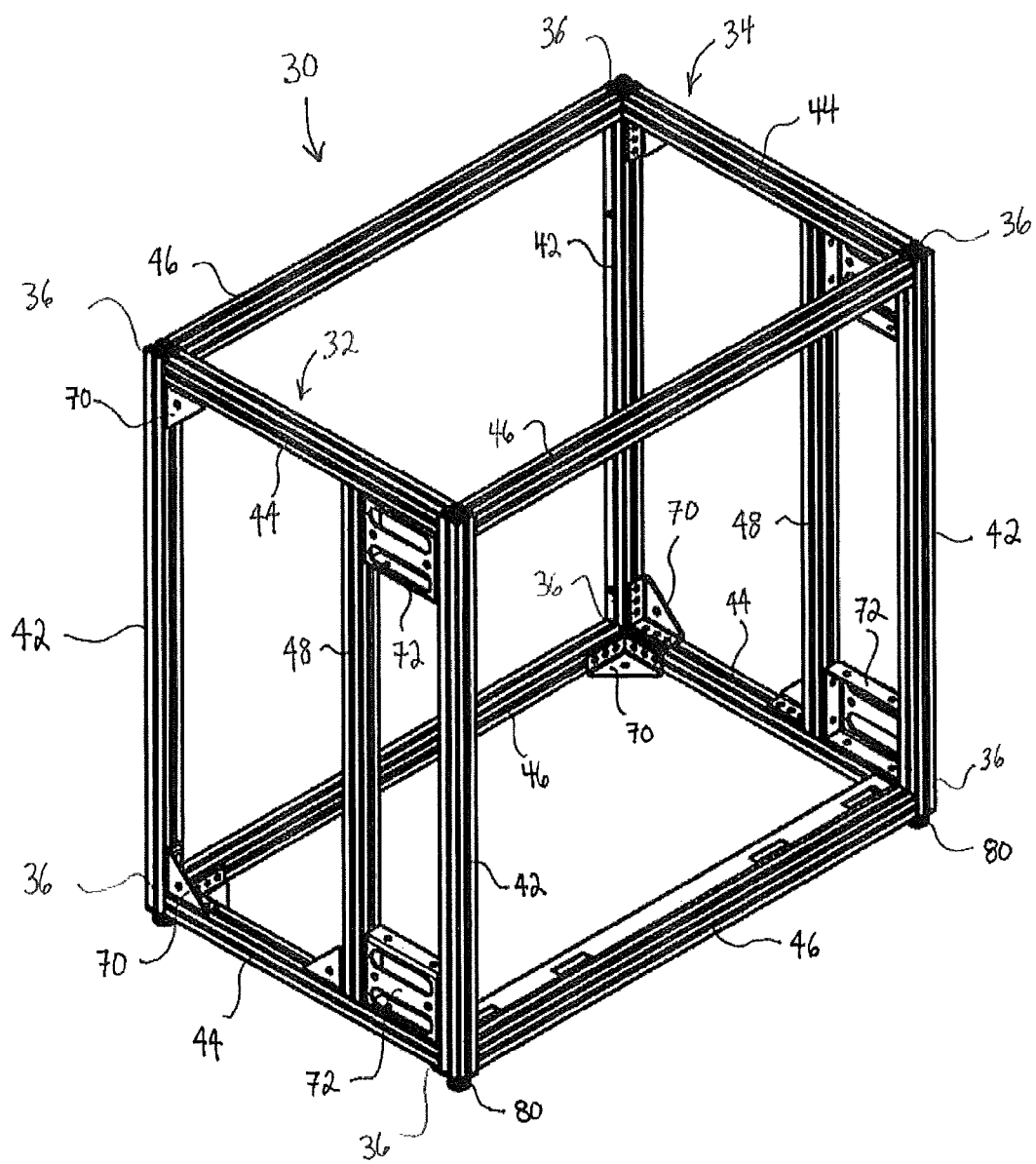
FIG. 2A is a perspective view of one embodiment of a frame of a console module according to the present disclosure.

FIGS. 1 to 13 show one embodiment or type of a frame according to the present disclosure. For example, FIG. 2A shows frame 30 of a console module. Frame 30 generally comprises a plurality of frame supports, including side supports 42, lateral supports 44, and cross supports 46. Frame 30 can comprise first and second spaced apart frame sections 32, 34. Each frame section can be formed of a pair of spaced apart side supports 42 and a pair of spaced apart lateral supports 44. The ends of side supports 42 can meet and form junctions 36 with the ends of lateral supports 44. Frame 30 can also comprise a plurality of cross supports 46, which interconnect frame sections 32, 34. In at least one embodiment, as shown in FIG. 2A, a cross support 46 extends between and joins each of the corresponding junctions 36 of first and second frame sections 32, 34. The ends of the frame supports may be fastened to one another by way of one or more connectors or brackets, such as triangular brackets 70. For the purpose of describing one or more embodiments of the present console module, side supports 42 will herein be referred to as "vertical supports". In addition, frame 30 can be supported above the ground or another surface by one or more feet 80. In at least one embodiment, the one or more feet 80 can be adjustable to allow for the adjustment of the distance between the ground and frame 30, and/or to allow for the leveling of frame 30 on the ground.

Figure 2B:
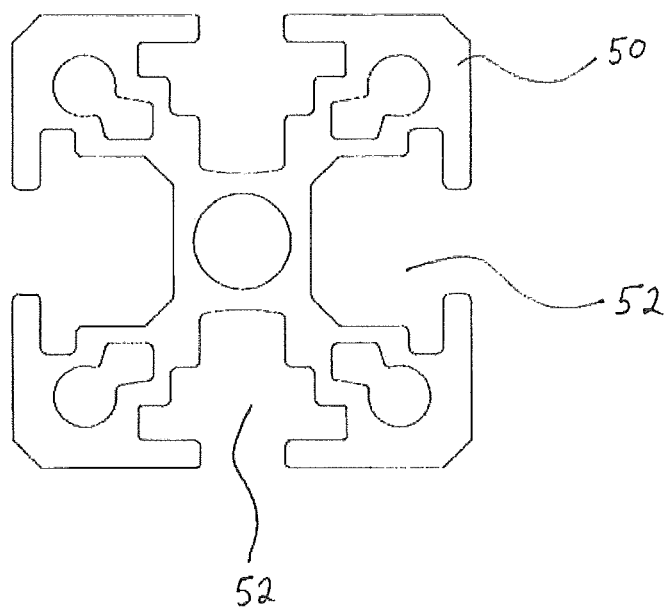
FIG. 2B is a cross-sectional view of a support in the form of an extrusion in at least one embodiment of the present disclosure.

The supports may be made of any suitable material known in the art, including but not limited to metal, such as aluminum or steel, wood, plastic, and a composite material. Furthermore, one or more of the supports may be in the form of an extrusion. However, non-extrusion supports are also contemplated. In the embodiment shown in the Figures, the supports take the form of metal extrusions. FIG. 2B shows a cross sectional view of an extrusion 50 in at least one embodiment. An extrusion can be shaped to receive or otherwise accommodate one or more fasteners or couplers, or a portion thereof. For example, in at least one embodiment, an extrusion can be adapted to receive and retain one or more nuts (not shown). An extrusion can define one or more tracks 52 therein. In at least one embodiment, one or more tracks 52 can be in the form of re-entrant channels. A re-entrant channel can be adapted for receiving and retaining fastening hardware. An object can be secured to the extrusion by way of a bolt, the end of which can be threadably received into the nut retained in the track or channel 52 of the extrusion. In at least one embodiment, an extrusion can be adapted to receive one or more #10 or ¼ inch nuts. In one or more other embodiments, an extrusion can be adapted to receive nuts or other fasteners of other sizes, including metric nuts. However, extrusions of other types and shapes can be used.

Figure 3:
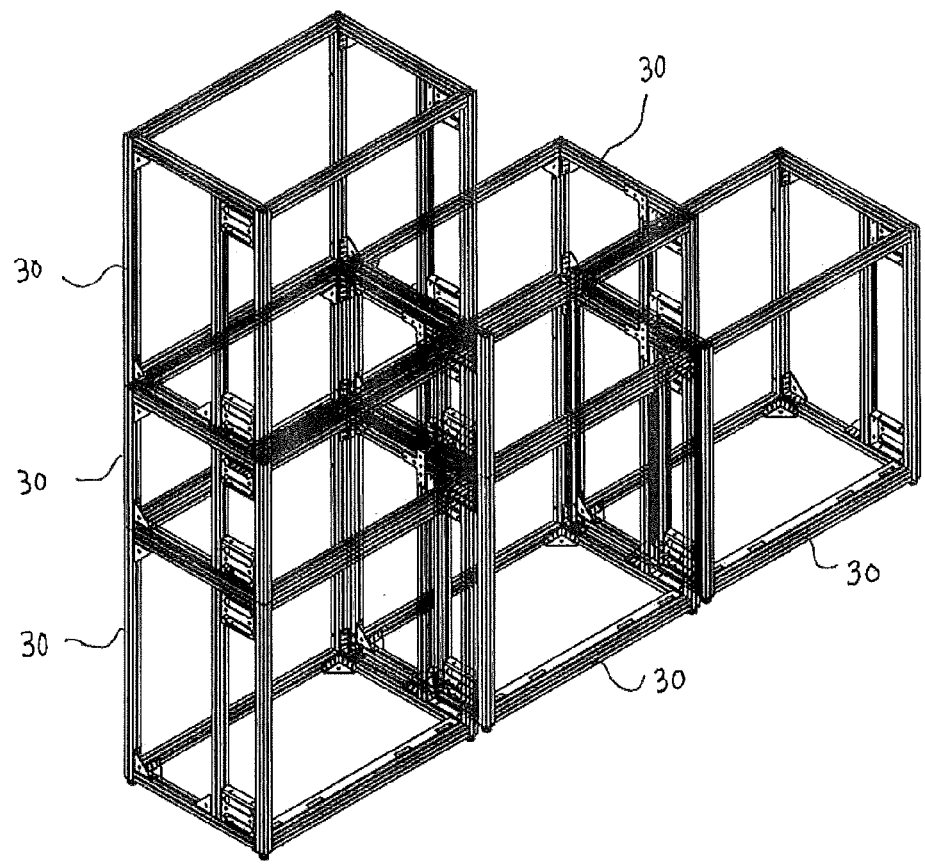
FIG. 3 is a perspective view of the embodiment of a console system shown in FIG. 1 showing only the console frames.

The shape and dimensions of frame 30 can be easily customized by merely selecting vertical supports 42, lateral supports 44, and cross supports 46 of the appropriate lengths. For example, FIG. 3 shows a plurality of frames 30 where two of the frames have a smaller height than the other frames. The customization of the dimensions of frame 30 can be straightforward and easy when the supports are cut to the proper length from a longer piece of material, such as may be the case where the supports are in the form of extrusions. Furthermore, when the supports take the form of extrusions, fastening adjacent supports to one another is simple and easy as little or no forming of holes in the extrusions is required. For example, the brackets or other fasteners can engage the slots or grooves in the extrusions and therefore no holes need be formed.

Figure 9C:
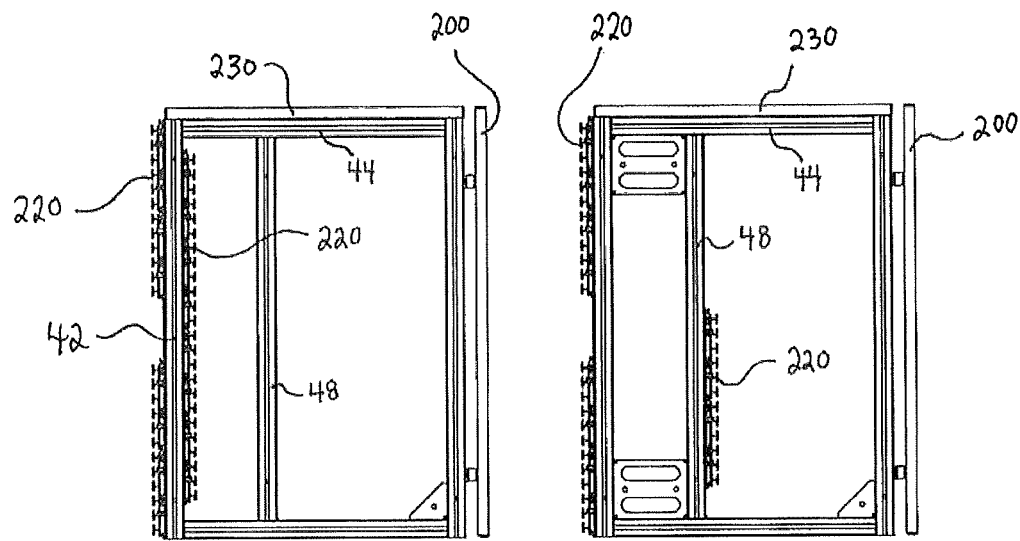
FIG. 9C is a partial perspective view of the embodiment shown in FIG. 9B.
Figure 9C:
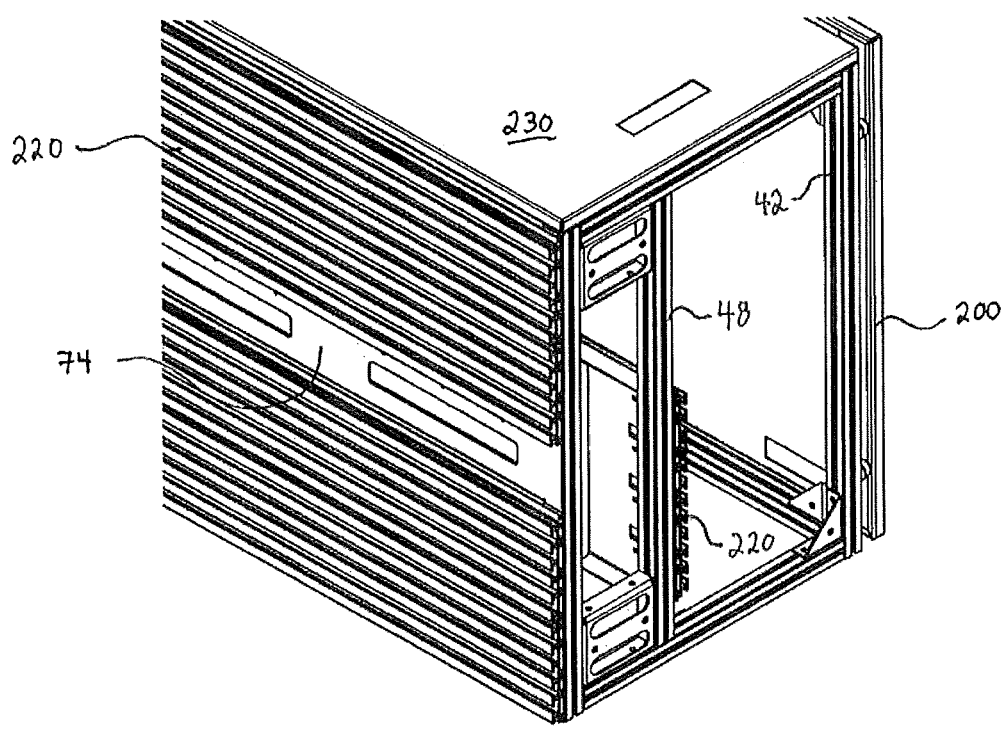

Turning back now to FIG. 2A, frame 30 may also comprise one or more brace supports 48. In the embodiment shown, frame 30 has a pair of brace supports 48 each being disposed between a different pair of lateral supports 44. The end portions of each brace support 48 may be coupled to lateral supports 44 by way of rectangular brackets 72. Each rectangular bracket 72 may also fasten a lateral support 44 to a vertical support 42. In this way, each brace support 48 rigidifies the side of frame 30 in which it is positioned. In at least one embodiment, as shown in the Figures, bracket 72 can be in the form of a box frame bracket. The remaining four sides of frame 30 may also be rigidified by way one or more brace supports 48 or other forms of braces (not shown). For example, FIGS. 1 and 9C show a number of lateral braces 74, which extend between a pair of vertical supports 42. In at least one embodiment, as shown in the Figures, lateral brace 74 can have a sheet-like form. For example, lateral brace 74 can be made of sheet material, such as for instance sheet metal. However, this additional bracing may not be necessary where a side is sufficiently braced by another structural component. For example, one or more sides of frame 30 may be fitted with one or more slat walls 220. In such a case, it may be redundant to brace frame 30 on a side having one or more of such components that act as a brace. Furthermore, it may be undesirable to have a brace on a particular side of frame 30 as the brace may restrict or block access into the space defined by frame 30. For example, a brace could restrict manual access to equipment located within frame 30, or could hamper or prevent the installation or removal of such equipment. In other instances, the frame may be sufficiently rigid on its own and therefore may not require any bracing.

Although the various supports of frame 30 are described and illustrated as being interconnected by way of triangular brackets 70 and rectangular brackets 72, this is certainly not meant to be limiting. Other fastening or connecting means are possible. These include but are not limited to bolts, screws, clamps, brackets, welds, and any other suitable fastening means known in the art. In some embodiments, two or more adjacent supports may be integrally formed and therefore would not require any fastening means.

Furthermore, in at least one embodiment, a frame will be a fully self-supporting unit. In other words, the frame itself will be sufficiently strong and rigid for an intended application. Thus the frame will not require any additional strength-increasing components or features, such as for example braces, doors or reinforcing panels. This is discussed further below.

Interconnection of Frames

The interconnection or intercoupling of multiple modules is now described. As previously mentioned, FIG. 1 shows an example composition and arrangement of console modules 20, 21, 22, 23, 24, 25. FIG. 3 represents the same composition and arrangement shown in FIG. 1 but only shows the frames of the modules.

It may be desirable to secure each console module to at least one adjacent console module. A first module may be coupled to a second module by first substantially aligning at least one frame support of the first module with and adjacent to at least one frame support of the second module. The one or more aligned and adjacent frame supports of the two consoles may then be connected to one another by way of one or more couplers or coupling assemblies.

Figure 4:
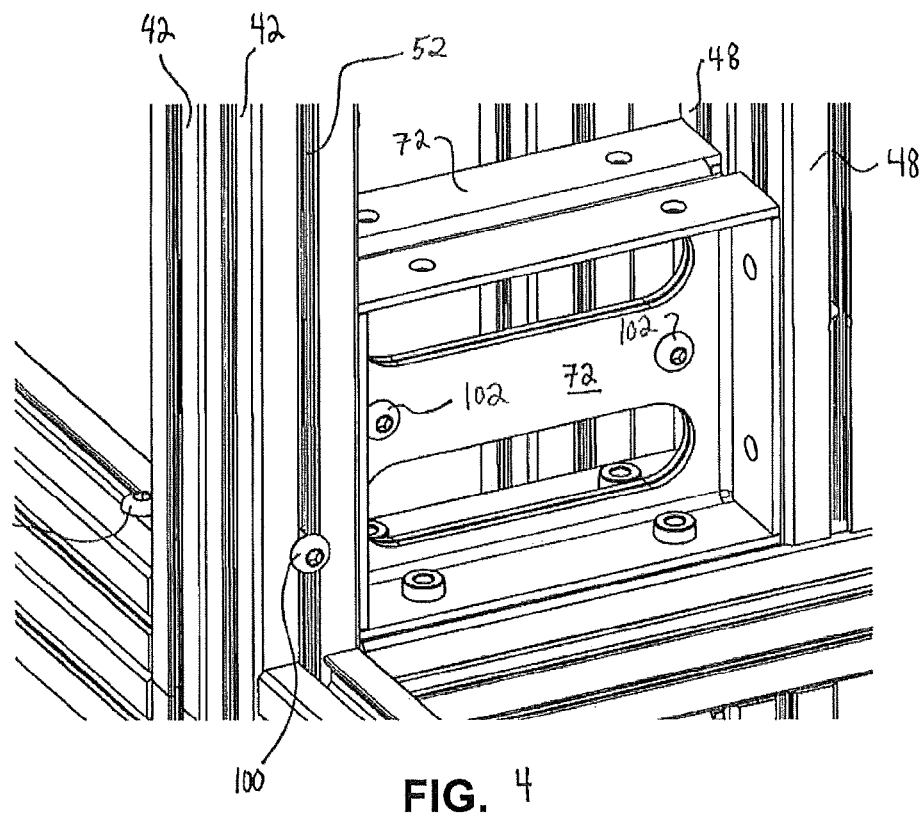
FIG. 4 is a close-up perspective view of two adjacent console modules in at least one embodiment of the present disclosure.

Various ways and means of securing modules together are contemplated. For example, one way of securing adjacent modules together is by way of one or more couplers or fasteners, such as bolts, screws or rivets. FIG. 4 shows a close-up view of a pair of lower corners of two frames 30 positioned side by side. Vertical support 42 of a first frame is secured to vertical support 42 of a second frame by way of a bolt 100. In addition, it may be possible to secure adjacent modules to one another by fastening a bracket of a first frame to a bracket of a second frame. For example, FIG. 4 shows bracket 72 of a first frame fastened to bracket 72 of a second frame through two bolts 102.

Figure 5:
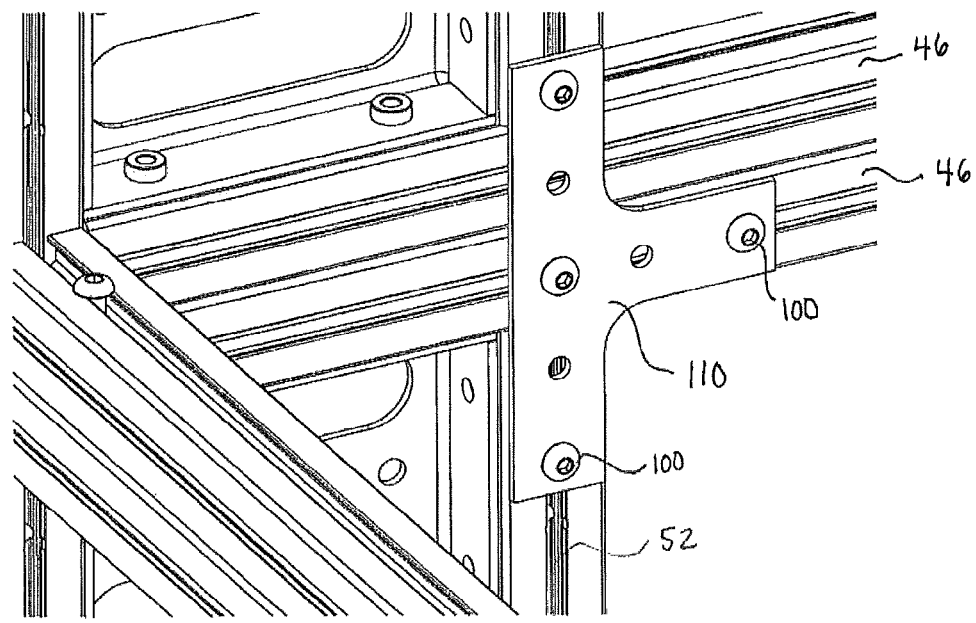
FIG. 5 is a close-up perspective view of two adjacent console modules in at least another embodiment of the present disclosure.

Another way of securing adjacent modules to one another is by way of one or coupling assemblies. A coupling assembly can be in the form of a bracket, including but not limited to a sheet metal bracket, and one or more fasteners. As an example, FIG. 5 shows a close-up view of a pair of proximate or abutting cross supports 46, the first forming part of a lower frame 30 and the second forming part of an upper frame 30 positioned on top of the lower frame. The upper frame is secured to the lower frame by way of T-bracket 110 and a number of fasteners 100 in the form of bolts. It will be appreciated however that T-bracket 110 is only an example and is not meant to be limiting. Rather, persons skilled in the art will appreciate that other types and forms of brackets and fasteners can be used.

Figure 6A:
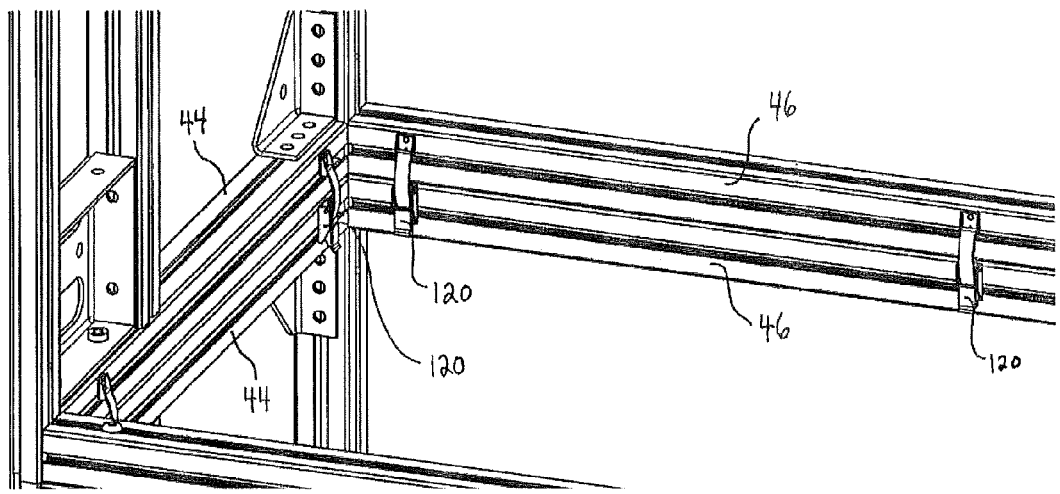
FIG. 6A is a close-up perspective view of two adjacent console modules in at least another embodiment of the present disclosure.
Figure 6B:
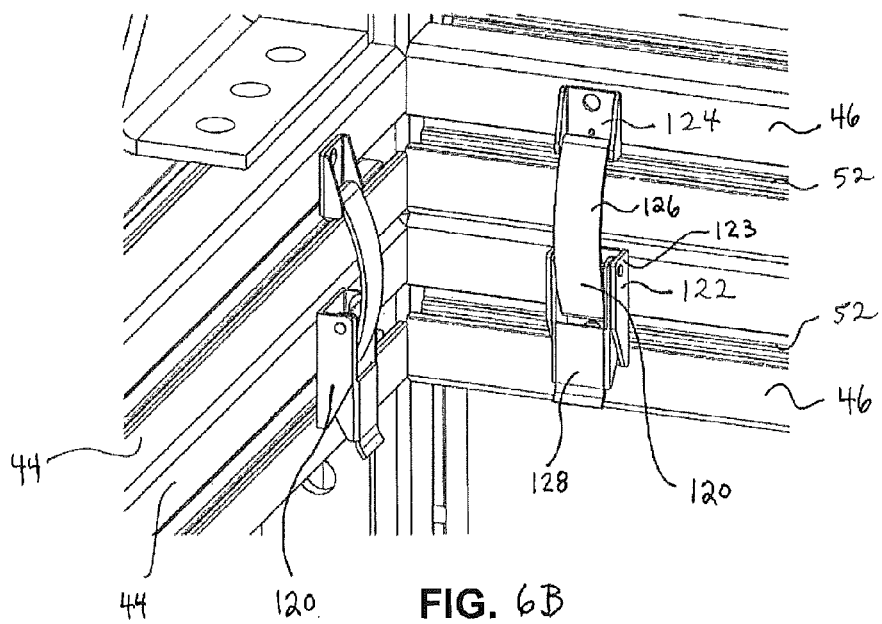
FIG. 6B is a close-up perspective view of the embodiment shown in FIG. 6A.

Yet another approach to securing adjacent modules together is to employ one or more coupling assemblies in the form of latches. One advantage of using latches is that they can be quickly and easily engaged and disengaged. Another advantage is that many types of latches may be operated without the use of any tools. FIGS. 6A and 6B show one example in which two frames are secured to one another using a number of spring latches 120. In at least one embodiment, as shown in these Figures, a spring latch can be in the form of an over-centre draw latch. As best shown in FIG. 6B, in this embodiment a first portion 122 of latch 120 can engage or otherwise be attached to cross support 46 of a first frame, here the lower frame. First portion 122 can comprise a base 123, a catch 126 and a lever 128. A second portion 124 of spring latch 120 can engage or otherwise be attached to support 46 of a second frame, here the upper frame. Second portion 124 is sometimes referred to as a keeper. To engage latch 120, the distal end of lever 128 is positioned away from base 123. The distal end of catch 126 is then engaged with keeper 124 and lever 128 is pivoted towards base 123 until it snaps into position. In at least one embodiment, catch 126 can be curved and can be made of resilient material so as to bias first portion 122 towards keeper 124. A catch having such features can reduce the chance of the catch disengaging the keeper when one or more of the frames are subjected to an impact or to vibrations. In at least one embodiment, latch 120 need not comprise keeper 124. Rather, catch 126 can directly engage a support of an adjacent frame. For example, in the embodiment shown in FIG. 6B, catch 126 could engage track or re-entrant channel 52 in support 46 of the upper frame rather than engaging keeper 124. Other configurations are possible.

Figure 7A:
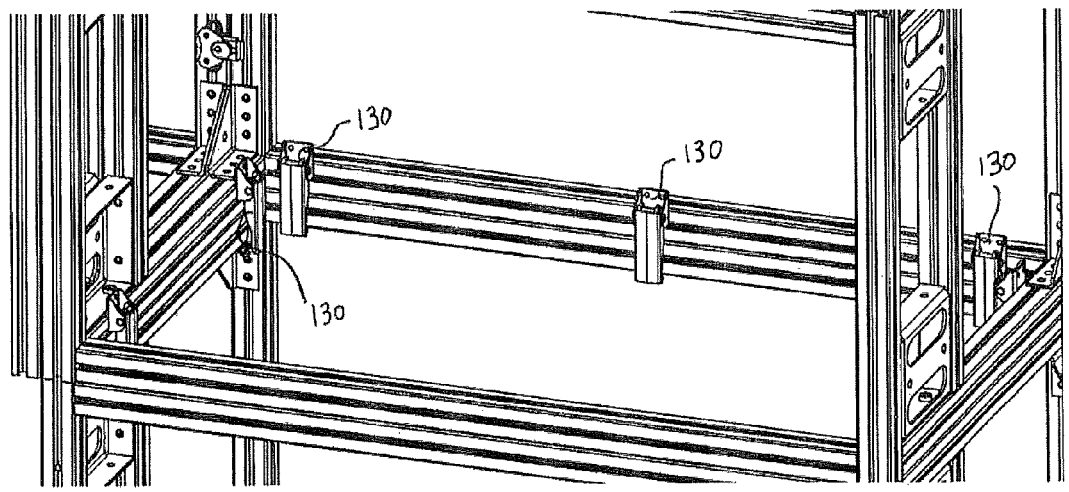
FIG. 7A is a close-up perspective view of two adjacent console modules in at least another embodiment of the present disclosure.
Figure 7B:
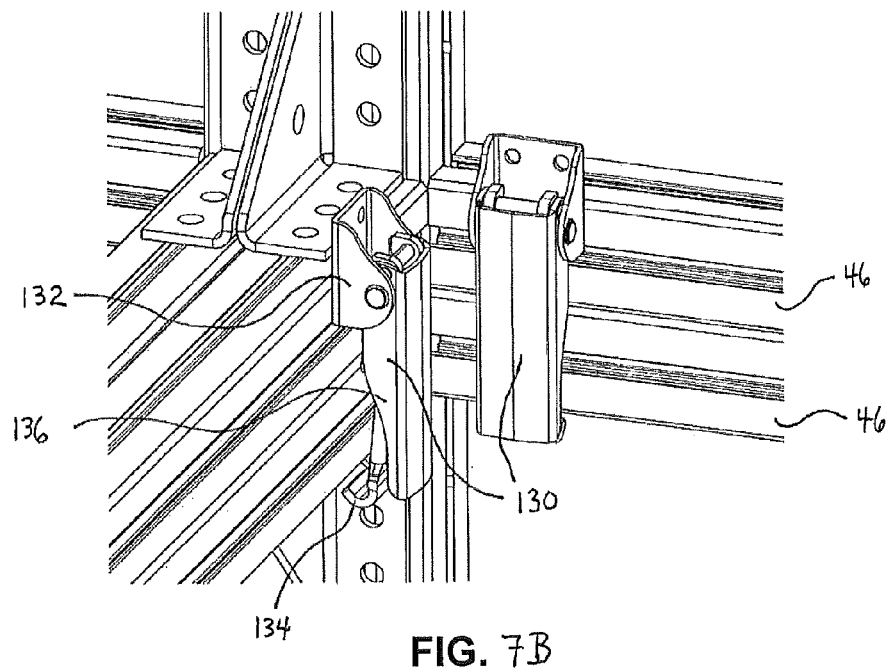
FIG. 7B is a close-up perspective view of the embodiment shown in FIG. 7A.

FIGS. 7A and 7B show another example wherein two frames are secured to one another using a number of cam latches 130. In at least one embodiment, as shown in this example, a cam latch can be in the form of an under-centre draw latch. In this embodiment, a first portion 132 of cam latch 130 engages or is attached to a first support of a first frame, here the upper frame, while a second portion 134 engages a second support of a second frame, here the lower frame. A lever 136 of cam latch 130 moves second portion 134 between engaged and unengaged positions.

Figure 8A:
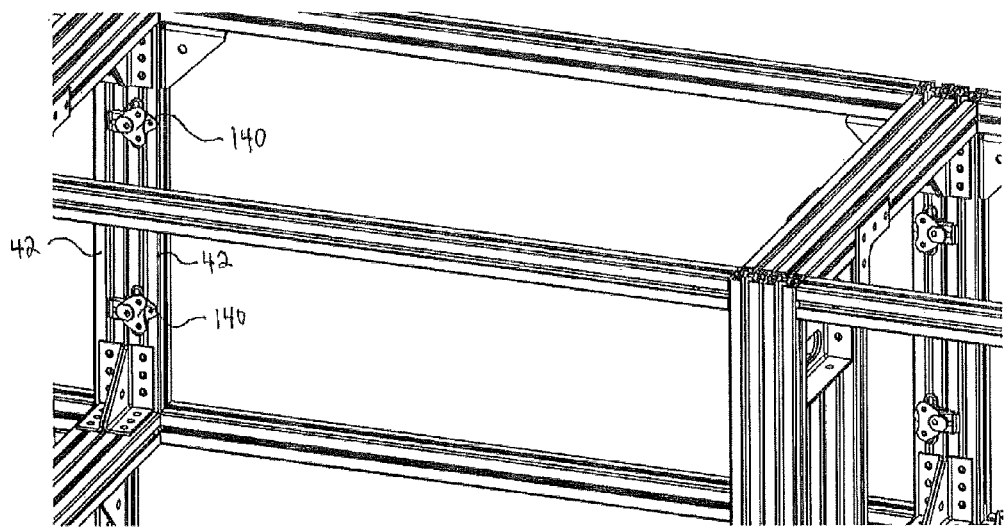
FIG. 8A is a close-up perspective view of two adjacent console modules in at least another embodiment of the present disclosure.
Figure 8B:
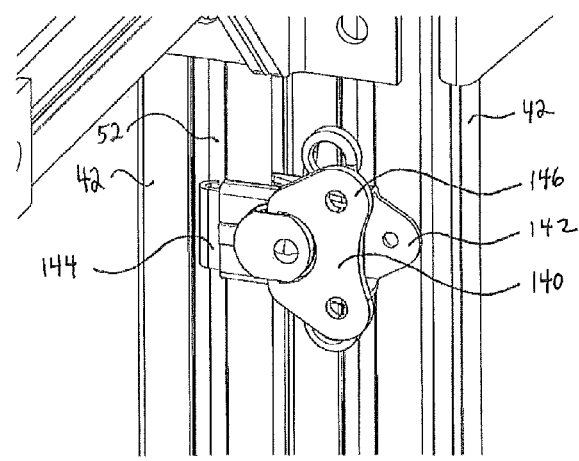
FIG. 8B is a close-up perspective view of the embodiment shown in FIG. 8A.

FIGS. 8A and 8B show yet another example in which adjacent frames are secured to one another using a number of rotary action latches 140. In at least one embodiment, as shown in this example, a rotary action latch can take the form of a rotary action draw latch. FIG. 8B is a close-up view of a rotary action latch 140 in which a first portion 142 of latch 140 engages or is attached to a first vertical support 42 of a first frame, here the frame on the right, while a second portion 144 engages a second vertical support 42 of a second frame, here the frame on the left. In this embodiment, second portion 144 is hook-shaped. Second hook-shaped portion 144 is movable relative to first portion 142 by rotating tab 146 about the latch.

In at least one embodiment of the present disclosure, one or more keepers can be used in combination with a latch. A keeper can be used to provide a latch with a structure to latch onto. For example, this is described above in relation to the embodiment shown in FIGS. 6A and 6B. Keeper 124 is secured to support 46 of the upper console frame. However, a keeper can be used with any other type of suitable latch or fastener, including all of the latches described above in relation to FIGS. 6A to 8B. However, in at least one or more other embodiments, a latch can directly engage a frame support. For example, a latch can engage track or channel 52 of a frame support.

Although several different latches have been described herein and illustrated in the Figures, it is to be appreciated however that other forms and types of latches are contemplated.

In the embodiments shown in FIGS. 5 to 8B, the various types of securing means (brackets, latches, etc.) are positioned on the interior sides of frames 30. In other words, they not positioned on the outer facing sides of supports 42, 44, 46, 48. This may be desirable so that the securing means do not interfere with the connection of panels, slat walls, or any other equipment or objects on an outer face of a frame. In other instances, it may be desirable to position securing means on an outer face of a frame. For example, this may be done so that the securing means do not interfere with any equipment or objects positioned or installed within the frame.

In addition or as an alternative to latches, other types of tool-less securing means may be used. For example, thumb screws could be used, possibly in the place of regular bolts or screws. Another possibility is to use one or more pins to secure two frames together. In one example, a pin that extends completely through a first support of a first frame and through a second support of a second frame can be used. The pin can be retained in position by way of a clip, such as an R-clip, or by a pin, such as a cotter pin or a split pin. Other types of tool-less hardware that could be used include spring plungers and clamps.

The securing means of the present scheme may also comprise locking means to prevent or deter unauthorized disassembly of a console. For example, one or more latches may have locking means or may receive a lock to prevent disengagement of the latch. In another example, one or more fasteners used to secure frames to one another could be of the type that is normally only removable with a keyed tool. Other locking or anti-tampering means known in the art are also contemplated.

Equipment Supporting Hardware

A range of equipment supporting hardware is now described.

A console module may comprise equipment supporting hardware to support equipment or other objects on the interior or the exterior of the module's frame. FIG. 1 shows some example equipment supporting hardware, including slat wall panels 220 and work surfaces 300. In the embodiments shown in FIG. 1, slat wall panels 220 are attached to the frames of the console modules. A slat wall panel allows one or more objects to be horizontally and vertically positionable on the slat wall. Thus slat walls allow equipment or other objects to be positioned on a console at any desired location on the slat wall, thereby providing a high level of customization. FIG. 1 also shows a pair of work surfaces 300 mounted on slat wall panels 220. Work surface 300 is also clearly shown in FIG. 13. Each work surface 300 shown in the Figures has a pair of arms 304, the distal ends of which engage a slat wall. In addition, work surface 300 may also have one or more supports 302 to brace or provide additional support thereto. In other embodiments, the position of a work surface could be adjustable by way of an actuator, such as an electric motor.

Equipment supporting hardware may also be positioned within frame 30 of a console module. FIGS. 9A-9C show a couple of different possible configurations for one or more slat walls 220 within a module. The desired position of a slat wall 220 within a module may depend on the shape, size and desired position of an object to be mounted on the slat wall. In a first example, FIG. 9A shows one or more slat walls 220 positioned between a pair of vertical supports 42 and facing towards the interior of the module. In a second example, FIGS. 9B and 9C show a slat wall 220 positioned between a pair of brace supports 48. This may be an option where it is desirable to support an object closer to an unobstructed side of a module, such as the side enclosed by panel 200 in FIGS. 9A-9C. Panel 200 can be removed or swung open to provide access to the interior of the module.

Figure 10:
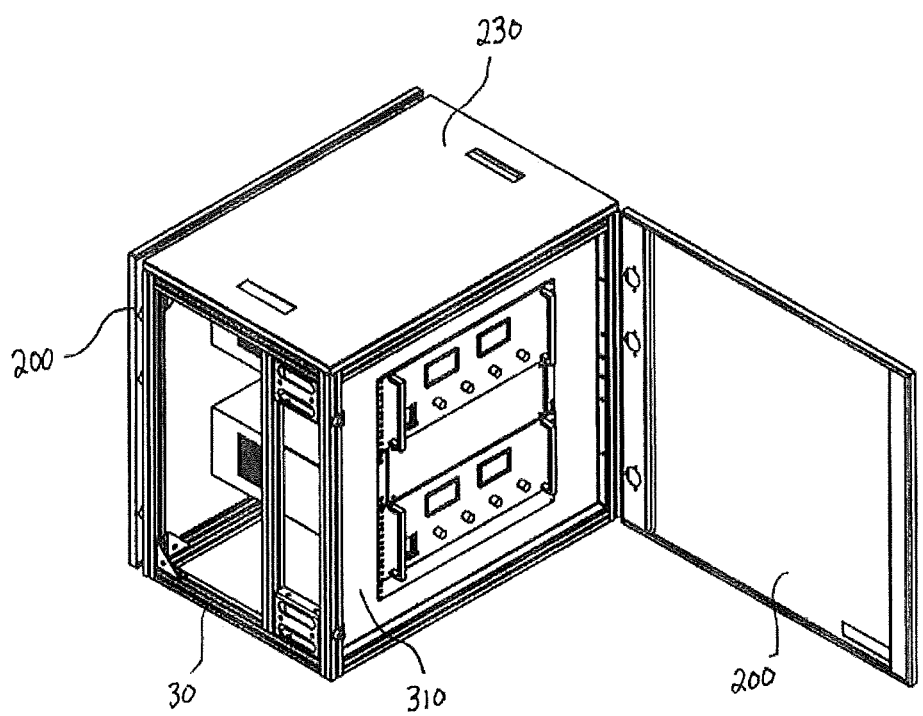
FIG. 10 is a perspective view of another embodiment of a console module having a rack mount installed therein.

FIG. 10 shows a module that has been outfitted with a rack mount 310. Rack mount 310 can be attached to frame 30 in any suitable manner. Furthermore, the rack mount may be a standardized 19-inch rack to accommodate one or more 19-inch equipment units. However, it is to be appreciated that a console module can be outfitted with any other suitable rack mount or equipment mounting means. For example, any type and number of shelves, housings, mounting rails, brackets, etc. may be attached to or otherwise supported by frame 30 of a console module.

Panels and Doors

A console module may also comprise one or more panels or "skins". These panels may be used to partially or fully close off one or more sides of a frame. For example, the front facing sides of modules 20, 23 and 25 shown in FIG. 1 each have a panel 200. In addition, the top sides of modules 22, 24 and 25 are covered by panels 230. A panel may be attached to a module in any suitable way. For instance, a panel can be hung or suspended on a side of a module. A panel could also be connected to a module by way of attachment hardware, such as bolts, screws, snap-fit connectors, and hinges to name but a few. FIG. 10 shows one embodiment in which at least one of panels 200 is hingedly connected to frame 30 of the module.

A panel of a module may or may not provide structural support to the module. For example, a panel may be attached to several supports that form the frame of a module, thereby possibly increasing the rigidity of the frame. In other instances, a panel may not or need not provide any structural support to the frame or module. In the latter situation, a panel may be removed or replaced without compromising the structural integrity of the module. Furthermore, in at least one embodiment, a panel can be removed or replaced without disturbing any equipment located within the module. In this way, several or all of the panels of a larger console system may be replaced with little or no operational downtime to the equipment installed on the modules. It may be desirable to replace the panels of the modules of a console system in order to change the aesthetics of the console. For example, a panel can be replaced with a new panel of a different colour, style, and/or material.

In addition, one or more panels or doors can comprise or define one or more vent openings for allowing ventilation of the interior space of the module. This may be desirable to allow for passive or active heat dissipation, for example when electronic or other heat producing devices are disposed within the module. In one or more embodiments, a console module can include one or more mechanisms, such as a fan, for inducing airflow out of or into the interior space defined by the console. In at least one embodiment, a fan or other mechanism can be disposed at or proximate an opening in a panel for forcing air through the opening.

Customization, Reconfigurations, etc.

Some of the features and advantages of the present scheme are now described.

The present console module and console system provides for a high level of customization at a low cost. In one aspect, one or more console modules may be arranged in a specific layout or footprint. For instance, a console may be configured for the specific shape or dimensions of a room or other environment. This includes irregularities in the environment, such as for example a support column in a room. A console could also be configured to have corners or sectioned curves to follow a curved or irregularly shaped wall. In addition to the foregoing, the modularity of the present console system allows additional modules to be added to an installed console at a later date.

Figure 12:
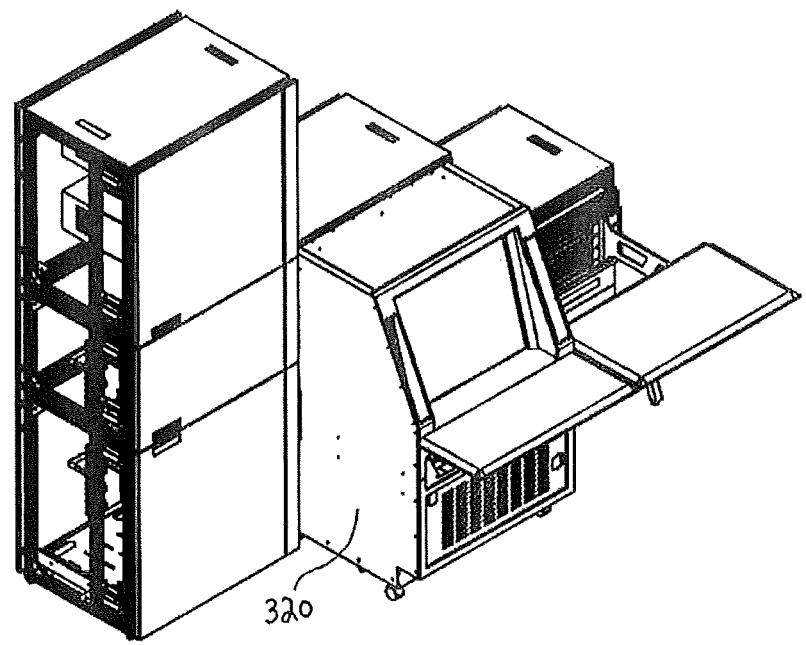
FIG. 12 is a perspective view of another example embodiment of a console system comprising a plurality of console modules.
Figure 13:
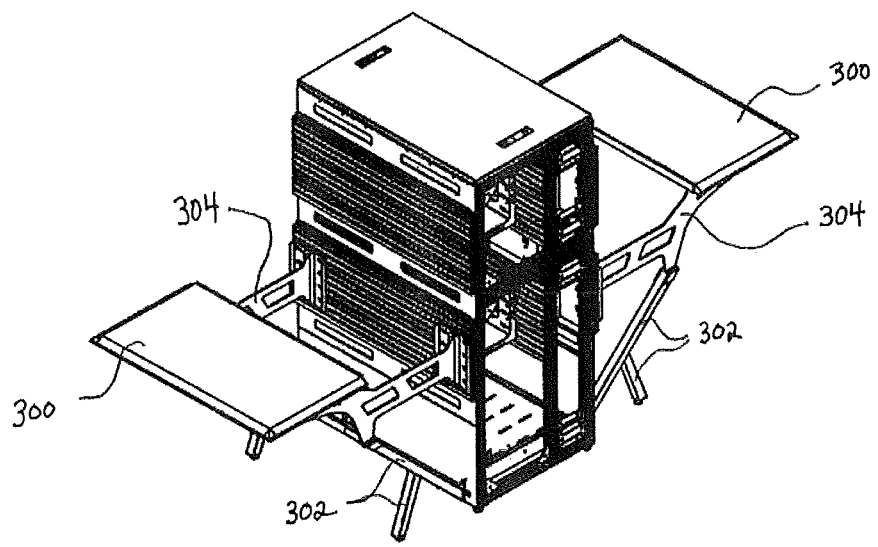
FIG. 13 is a perspective view of another example embodiment of a console system comprising a plurality of console modules with mounting hardware and equipment disposed on opposite sides thereof.

In another aspect, a console can be configured for one or more specific applications. For example, one application may necessitate a lot of equipment storage space. In such a case, the overall console could include a number of tall console sections to house and/or support the equipment. Each tall console section could consist of a single, tall console module, or it could consist of two or more shorter console modules arranged one on top of the other. Examples of this latter configuration are shown in FIGS. 1 and 12, in which a module section consists of three console modules stacked vertically. Another application could necessitate one or more low profile console sections in order to allow a person to see over the console. An air traffic control application is an example of where this may be required. Other example configurations of modules are shown in FIGS. 12 and 13. FIG. 13 shows a configuration in which equipment is positioned on opposite sides of a console. These examples demonstrate the high level of customization achievable with the present console system.

The shape and/or dimensions of an individual console module are also easily customizable. As described above, the frame 30 of a module is generally made up of a number of vertical, lateral, and cross supports. Therefore the shape and dimensions (i.e. height, width, and depth) of a module can be readily customized by selecting the various supports of the lengths required to achieve the overall desired dimensions. This is another aspect of the present scheme that provides a high level of customization at low cost.

Another feature of the present scheme is the extent and ease with which modifications can be made to an assembled console. It is possible and straightforward to remove, add, and replace one or more modules of a console. Furthermore, this can often be done without impacting any adjacent modules or the equipment supported in or on the adjacent modules. This functionality is at least partially a product of each module being a self-supporting structural unit.

Figure 11B:
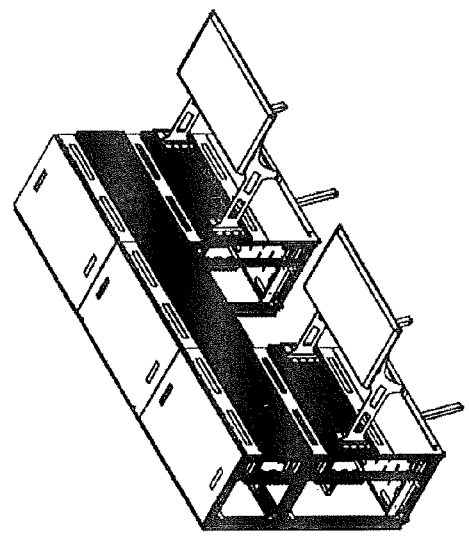
FIG. 11B is a perspective view of the console system shown in FIG. 11A with a middle lower console module having been removed.
Figure 11A:
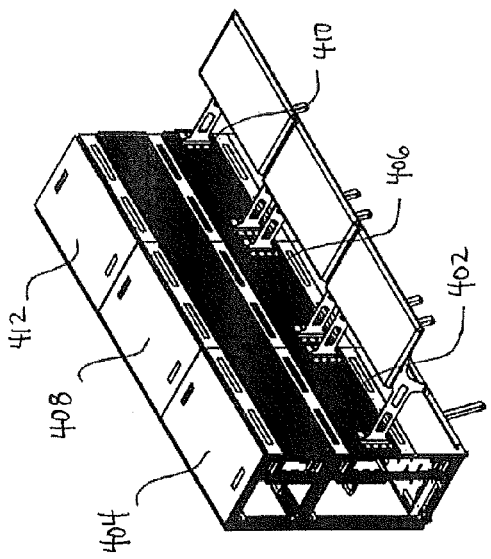
FIG. 11A is a perspective view of another example embodiment of a console system comprising a plurality of console modules.
Figure 11C:
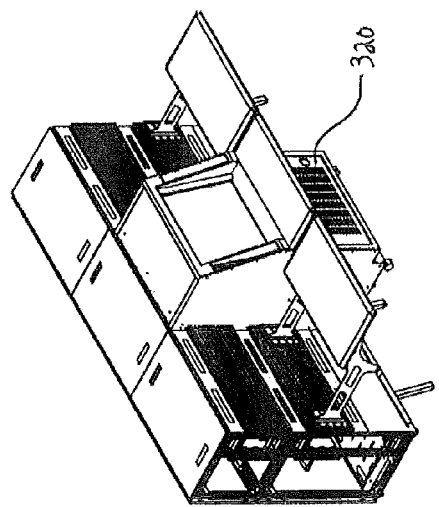
FIG. 11C is a perspective view of the console system shown in FIG. 11A with the middle lower and upper console modules having been replaced with another unit.

FIGS. 11A-11C show a console and a two example modifications that could be carried out to the console. Firstly, FIG. 11B shows the console of FIG. 11A with lower middle module 406 removed. Here, lower middle module 406 can be removed without moving, disassembling or otherwise disrupting any of the adjacent modules. Before removing the lower middle console, it would normally be necessary to ensure that upper middle module 408 is attached to at least one other module, such as one of upper left and upper right modules 404, 412. Once this has been done, lower middle module 406 would then be detached or unfastened from any other modules, such as one or more of lower right and left modules 402, 410 and upper middle module 408. Lower middle module 406 could then be slid out and away from the console.

The ability to quickly and easily remove and replace a module would be useful, for example, during an equipment upgrade and an equipment failure. The downtime of the equipment stored in and on the module could be minimized if the installed module is removed and a second replacement module outfitted with equipment is immediately installed in its place.

Secondly, FIG. 11C shows the console of FIG. 11A with both lower and upper middle modules 406, 408 having been removed and replaced by a freestanding equipment unit 320. Similarly to the modification shown in FIG. 11B, here lower middle module 406 and, if necessary, upper middle module 408 are detached from the adjacent modules. These two modules may then be removed from the console without affecting the adjacent modules. The freestanding equipment unit may then be positioned in the opening left by the removed modules.

It is to be understood that these two modifications are merely example. Other modifications are possible. For instance, additional modules may be added to a console in any arrangement, including side by side, front to back, and vertically.

Another Embodiment

Figure 14A:
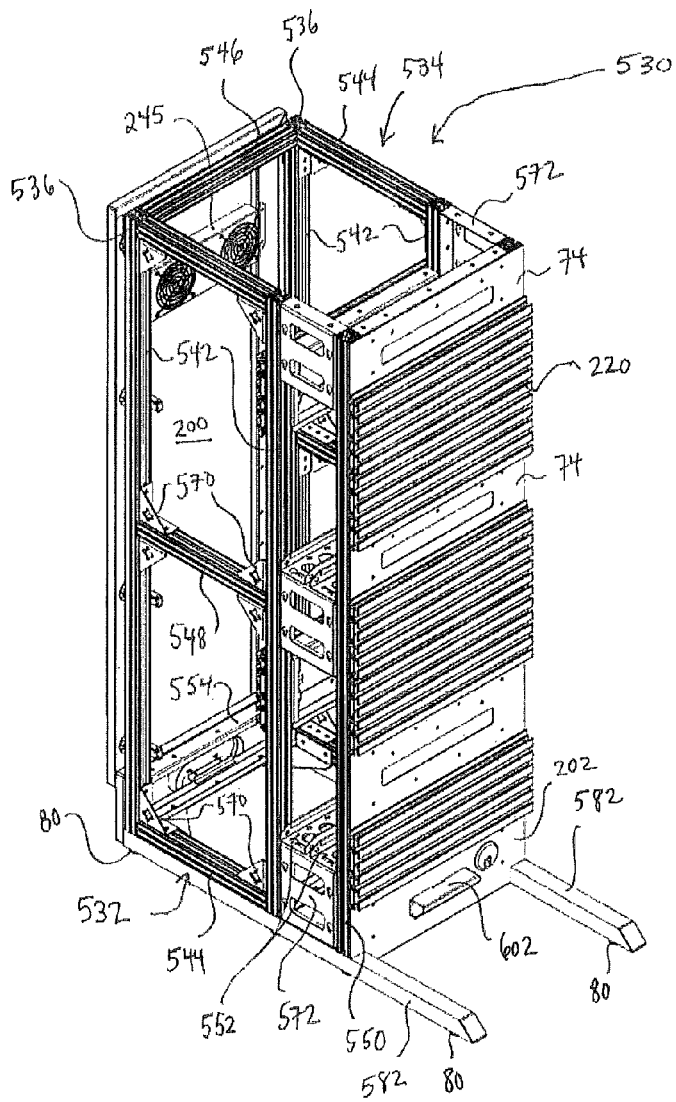
FIG. 14A is a perspective view of another embodiment of a console module according to the present disclosure.

FIGS. 14A to 15, 18 and 20 show other possible embodiments of the present console module. These embodiments comprise a slightly different frame and are shown with various other features and equipment supporting hardware. For example, FIG. 14A shows a module comprising frame 530, which is similar in some regards to frame 30 of the embodiments shown in FIGS. 1 to 13. A very similar frame to the one shown in FIG. 14A is shown in isolation in FIG. 20. Frame 530 generally comprises side supports 542, herein referred to as "vertical supports" for descriptive purposes, lateral supports 544, and cross supports 546. Frame 530 can comprise first and second spaced apart frame sections 532, 534, which each include vertical supports 542 and lateral supports 544. The ends or vertices of side supports 42 meet and form junctions 536 with the ends of lateral supports 544. Frame 530 can also comprise one or more cross supports 546 for interconnecting frame sections 532, 534.

Figure 20:
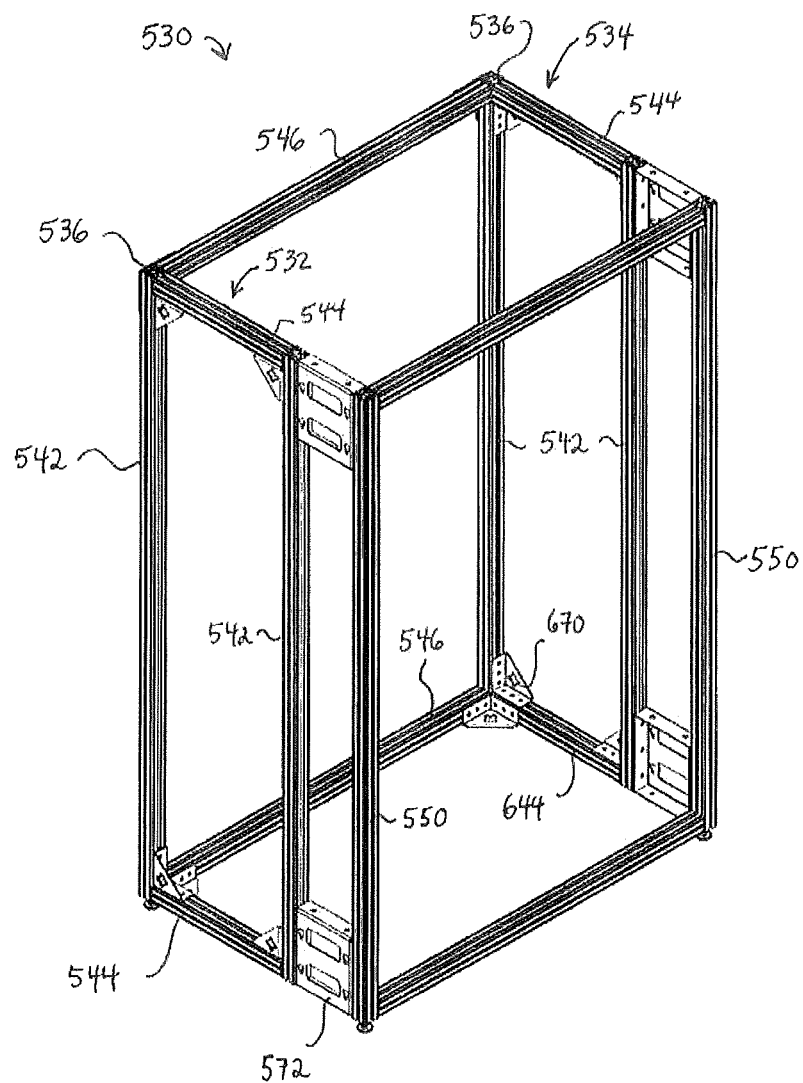
FIG. 20 is a perspective view another embodiment of a frame of a console module according to the present disclosure.

As best shown in FIG. 20, one or more cross supports 546 extend between and join first and second frame sections 532, 534 at corresponding junctions 536. However, although not shown, one or more cross supports can extend between and join the frame sections at positions other than junctions 536. In addition, the ends of the frame supports may be fastened to one another in any suitable way, including by way of one or more connectors or brackets, such as triangular brackets 570.

The description provided above in relation to the frame supports (e.g. side/vertical, lateral, and cross supports), namely the shape, function, material, etc. applies to the frame supports of the embodiments shown in FIGS. 14A to 15, 18 and 20. Although many of the frame supports are shown in the form of extrusions, this is not intended to be limiting. One or more of the frame supports can take any other suitable form. For example, as shown in FIG. 14A, a cross support disposed at the lower rear portion of the console module is in the form of a sheet metal support rather than an extrusion.

Figure 14B:
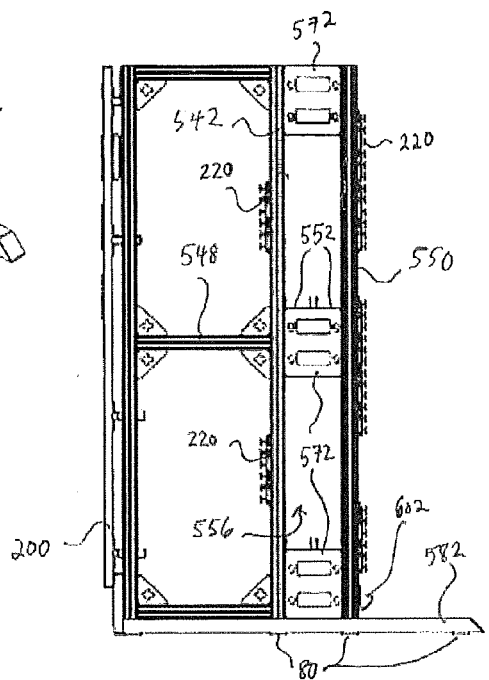
FIG. 14B is a side view of the embodiment shown in FIG. 14A.

Unlike the embodiments shown FIGS. 1 to 13, frame 530 can include a pair of secondary side supports 550 (herein referred to as secondary vertical supports for descriptive purposes), as best shown in FIG. 20. Each of secondary vertical supports 550 can be disposed outwardly and spaced away from a corresponding pair of vertical supports 542, and can be joined to vertical supports 542 by way of one or more connectors, such as rectangular brackets 572. This embodiment of the frame can be compared to the embodiment 30 of frame, which is shown in isolation in FIG. 2A. Embodiment 530 of the frame shown in FIGS. 14A to 15, 18 and 20 can provide substantially the same strength and functionality as frame 30 of the embodiments of the console module shown in FIGS. 1 to 13. However, frame 530 can provide for easier assembly of the frame itself and/or easier installation of equipment on or in the frame or console module. For example, equipment or other components can be installed in or onto the console before connectors 572 and secondary side supports 550 are assembled to vertical supports 542. For instance, with reference to FIG. 14B, one or more slat wall 220 can be mounted to vertical supports 542 before connectors 572 and secondary side supports 550 are connected to vertical supports 542. In addition, space 556 (see FIG. 14B) defined between secondary vertical supports 550 and corresponding pair of vertical supports 542 can be used to run cabling between adjacent console modules. For example, as shown in FIGS. 14A and 14B, the module can comprise one or more cable trays 552 extending within space 556. Cable trays 552 can also double as brace supports for contributing to the rigidity of the console module.

In addition, like frame 30 of the embodiments shown in FIGS. 1 to 13, frame 530 can also comprise one or more braces. As shown in FIGS. 14A and 14B, frame 530 can include one or more brace supports 548 extending between and joining two vertical supports 542. Brace supports 548 can be connected to any of the frame supports in any suitable way, including by way of one or more triangular brackets 570, and in any suitable orientation (e.g. horizontal, vertical, diagonal, etc.).

Furthermore, a console module can include one or more feet members 582 that extend outwardly from frame 530 for preventing the frame from tipping over. In one or more other embodiments, the console module can be secured in position to a floor, wall or other structure, thereby eliminating the need for one or more feet members.

Other Features

Some other features of the console module shown in 14A to 15, and 18, and accessories therefor, are now described.

As described above in relation to the first embodiment, a console module can include one or more panels or doors for partially or fully closing off one or more sides of the console. For example, the embodiment shown in FIGS. 14A and 14B comprises panel 200. A panel or door can comprise or define one or more vent openings for allowing for passive or active ventilation of the interior space of the frame. In one or more embodiments, a console module can include one or more mechanisms, such as a fan, for inducing airflow out of or into the interior space defined by the console. In at least one embodiment, a fan or other mechanism can be disposed at or proximate an opening in a panel for forcing air through the opening. For example, the console module shown in FIG. 14A includes fan assembly 245 disposed at one or more vent openings (not shown) in panel 200 for ventilating the console module.

In addition, a console module can comprise one or both of interior and exterior lighting. In at least one embodiment, as shown in FIGS. 14A and 14B, the console module can include lighting device 602 for projecting light on the exterior of the module. In this embodiment, lighting device 602 is disposed in a lower region of the module and can be shielded to provide floor lighting for dark room applications. The design of the light casing, and direction of light can prevent unwanted glare from being seen by an operator sitting or standing in front of the console. A lighting device can be added or removed from the console module by simply removing the device 602 or by removing or changing out panel 202, and thus need not affect any other component of the console.

A console module can include one or more lighting devices at other locations on the module for providing light on the exterior and/or the interior of the module. In addition, the one or more lighting devices can of any suitable type or types, including a light emitting diode type, an incandescent type, and a fluorescent type.

Figure 19:
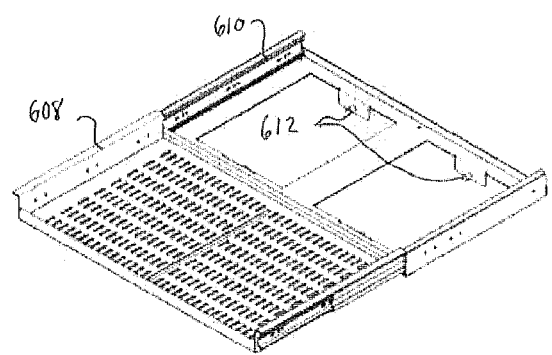
FIG. 19 is a perspective view of one embodiment of a slide-out shelf according to the present disclosure.

Furthermore, the console module can include or be adapted to receive one or more types of shelving. The shelving can be located or receivable on one or both of the interior and the exterior of the console. For example, the console module shown in FIG. 18 includes shelf 604 that engages slat wall panel 220 located on the interior of the module. The slat wall engagement of shelf 604 allows the shelf to be easily positionable at various horizontal and vertical positions on the console module. The console further includes slide-out shelf 606, which is shown in isolation in FIG. 19. Slide-out shelf 606 can include shelf frame 610, and shelf 608 being slidably engaged with frame 610. In at least one embodiment, shelf 606 can be installed and removed from the module without the use of any tools. For example, in the embodiment shown in FIG. 18, one or more frame supports or other frame components can contain one or more positioning holes to accept one or more pins or other connectors which are connected to shelf frame 610. The shelf can then be clipped or otherwise retained in place on the console module using the one or more connectors 612, such as spring-loaded mechanical release pins. Full-extension slides of the shelf can allow for full access to components placed on the shelf. One or more shelves can be custom sized, and placed in order to allow access for floor power/data ports, for example when the console is installed onto a raised floor. The console module can be adapted to receive and engage one or more shelves at multiple different positions in order to provide for multiple configuration options.

Figure 15:
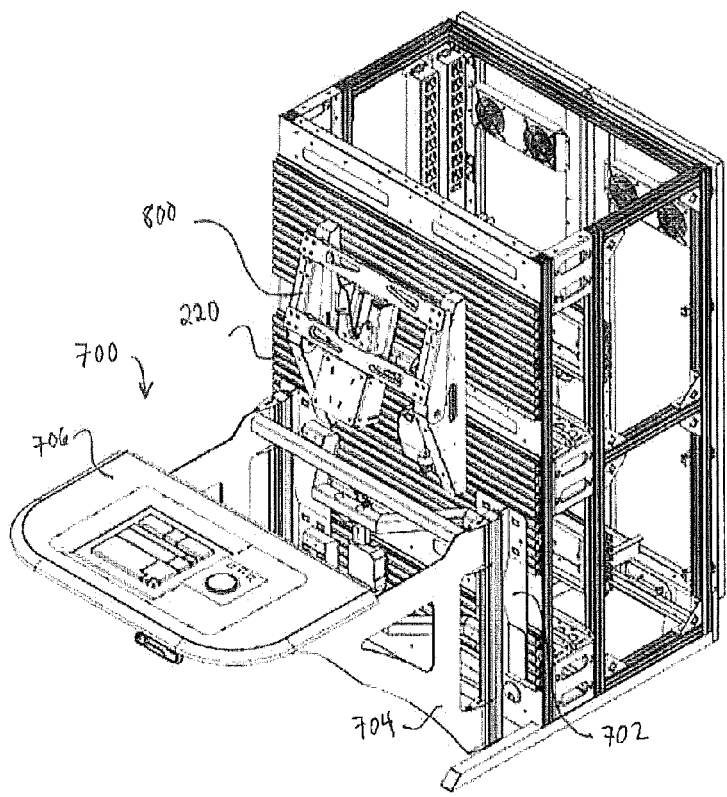
FIG. 15 is a perspective view of another embodiment of a console module, the module comprising an adjustable work surface and an adjustable mount.
Figure 16:
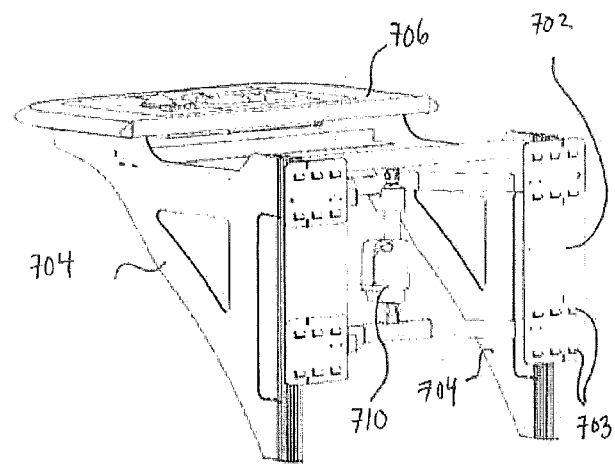
FIG. 16 is a rear perspective view of one embodiment of an adjustable work surface according to the present disclosure.
Figure 17A:
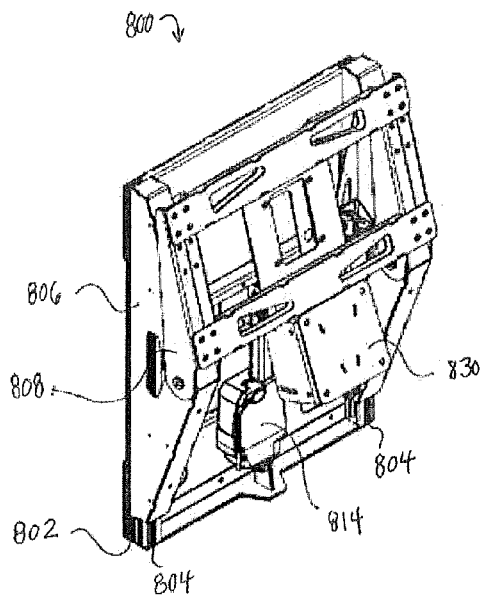
FIGS. 17A to 17D are a various views of one embodiment of an adjustable mount according to the present disclosure.
Figure 17B:
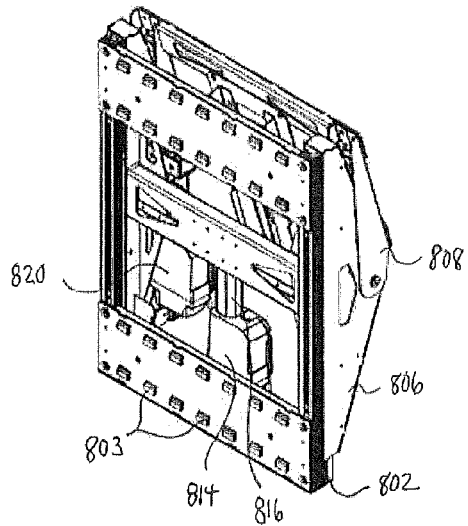
Figure 17C:
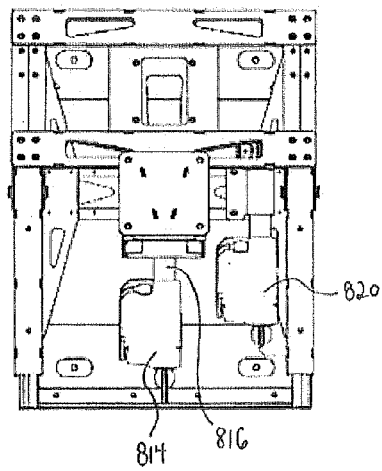
Figure 17D:
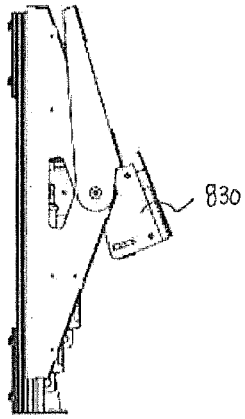
Figure 18:
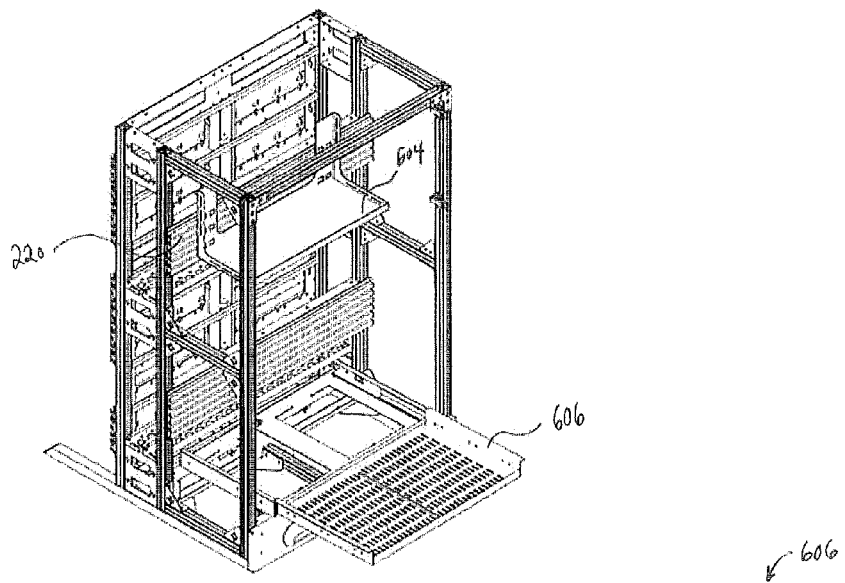
FIG. 18 is a rear perspective view of another embodiment of a console module, the module comprising various shelves.

In addition, a console module may include or be adapted to receive a height adjustable work surface or platform. FIG. 15 shows one embodiment of adjustable work surface 700 mounted to slat wall 220 of a console module. This embodiment does not have any support legs, which the result that the operator leg room is clear of any obstructions. FIG. 16 shows adjustable work surface 700 in isolation, the adjustable work surface generally comprising base 702 that is connectable to a structure such as a console module, work surface 706, and one or more supports 704 for supporting work surface 706 about base 702. The size and shape of work surface 706 can be customized for any application. Furthermore, adjustable work surface 700 can be constructed to provide any desired static loading capacity. For example, in one embodiment, work surface 706 can have a static loading capacity of approximately 300 lbs. In addition, the vertical position of work surface 706 will be generally adjustable relative to base 702. For example, in this embodiment, supports 704 are movably adjustable in a vertical direction relative to base 702 to permit for the selective adjustment of the height of work surface 706. In at least one embodiment, the vertical range of adjustment is approximately 6", which allows the desktop height to be positioned within the ergonomic standards for a seated 5th percentile female to a 95th percentile male. The adjustable work surface can comprise an actuator, such as electric linear actuator 710, for moving the one or more supports 704 relative to the base. Adjustment can be activated by a switch, not shown, which can be positioned on or in the work surface, or at any other suitable location. In addition, a controller in a system for adjusting the height of work surface 706 can be pre-programmed for adjustment to one or more specified heights. In one or more other embodiments, the height of work surface 706 can be manually adjustable rather than automatically adjustable by way of one or more actuators.

Base 702 can be connectable to a structure, such as a console module, in any suitable way. In the embodiment shown in FIGS. 15 and 16, base is mountable to a slat wall structure. Base 702 can include one or more slat wall engagement members 703, for example hook-like members for engaging one or more slats of a slat wall. Furthermore, in some embodiments, the installation and removal of adjustable work surface 700 to a structure such as a slat wall can be completed without the use of any tools. This allows for fast and simple installation, removal and repositioning of the adjustable work surface.

Furthermore, a console module may include or be adapted to receive an adjustable mount, for example for mounting equipment such as one or more display screens. FIG. 15 shows one embodiment of adjustable mount 800 mounted to slat wall 220 of a console module. Various views of the mount are shown in isolation in FIGS. 17A to 17D.

Adjustable mount 800 generally comprises base 802 for engagement with a support structure such as a console module, and support assembly 806 for supporting one or more pieces of equipment or other objects. Support assembly 806 can be adapted to couple to or mate with any type of equipment. In at least one embodiment, the support assembly will be adapted to implement one or more Video Electronics Standards Association (VESA) mounting interface standards, for example for mating with one or more displays. In one or more other embodiments, equipment to be coupled to the mount can be installed and removed without the use of any tools. Furthermore, equipment can be installed onto the mount after the mount has been positioned on a support structure. This can allow for an easier and safer installation of the mount onto a support structure.

In addition, support assembly 806 can be movably coupled to base 802 to allow for the positional adjustment of support assembly 806 relative to base 802. In particular, assembly 806 can slidingly engage and ride along side portions 804 of base 802 (e.g. in a vertical direction as shown in FIGS. 17A to 17D). The mount can also comprise one or more electric actuators 814 for moving assembly 806 relative to base 802. In the embodiment shown in the FIGS., actuator 814 is connected to base 802, and drives piston 816 which is connected to assembly 806 for moving the assembly relative to the base. However, other types of actuators and other configurations of one or more actuators in the mount are possible. In addition, in another embodiment, the movement of the assembly relative to the base can be performed manually rather than by way of an actuator.

Support assembly 806 can also comprise tiltable support 808, which can be pivotally connected along at least one pivotal axis to assembly 806. One or more pieces of equipment that are to be mounted can be coupled to this tiltable support thereby allowing the equipment to be tilted relative to the base. The pivotal axis of the embodiment shown in the FIGS. is orientated in a horizontal direction. However, the one or more pivotal axes can be orientated in any other suitable directions. The adjustable mount can also include one or more electric tilt actuators 820 (see FIGS. 17B and 17C) for pivoting tiltable support 808 about support assembly 806. In at least one embodiment, the amount or degree of tilt of tiltable support 808 with assembly 806 can be controlled by one or more cables, wires, chains, etc. (not shown) extending between assembly 806 and tiltable support 808. For example, actuator 820 can adjust the amount or degree of tilt by way of the one or more cables. However, in at least another embodiment, tiltable support 808 can be actuated by other means, for example manually by a person.

The positional adjustment of equipment coupled to mount 800 can be activated by any suitable means, for example one or more switches or buttons, not shown, which can be located at any suitable location. Furthermore, a controller in a system for adjusting the mount can be pre-programmed for adjustment to one or more specified positions or orientations.

Adjustable mount 800 can also include one or more electrical connectors 830 (see FIGS. 17A and 17D) for providing one or more of power, input signals, and output signals to one or more pieces of electrical equipment to be supported by the mount. The one or more connectors 830 can take any suitable form and is not intended to be limited to the connector shown in the FIGS.

Similar to base 702 of adjustable work surface 700 described above, base 802 of the adjustable mount is connectable or mountable to a support structure, for example a console module, in any suitable way. In the embodiment shown in FIGS. 15 and 17A to 17D, base 802 is mountable to a slat wall structure. Base 802 can comprise one or more slat wall engagement members 803, for example hook-like members for engaging one or more slat of a slat wall. In addition, in one or more embodiments, the installation, removal and repositioning of mount 800 on a structure can be accomplished without the use of any tools.

The structure, features, accessories, and alternatives of specific embodiments described herein and shown in the FIGS. are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment.

Furthermore, additional features and advantages of the present disclosure will be appreciated by those skilled in the art.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

Moreover, the previous detailed description is provided to enable any person skilled in the art to make or use the present invention. Various modifications to those embodiments will be readily apparent to those skilled in the art, and the generic principles defined herein may be applied to other embodiments without departing from the spirit or scope of the invention described herein. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims.

What is claimed:

1. A console module unit comprising:
   a self-supporting frame, the frame comprising:
      first and second spaced apart frame sections, each frame section comprising two spaced apart side supports and two spaced apart lateral supports, each lateral support disposed between and forming junctions with corresponding ends of the side supports;
      a plurality of cross supports interconnecting the first and second frame sections, wherein there is at least one cross support extending between and joining each of the corresponding junctions of the first and second frame sections, the plurality of cross supports and the first and second frame sections forming the self-supporting frame;
      at least one brace support, the at least one brace support coupled to and extending between two opposing side, lateral or cross supports of the frame; and
      at least one box frame bracket, the at least one box frame bracket connecting the brace support to one of the two opposing side, lateral or cross supports and to another of the supports of the frame that is adjacent to the one of the two opposing side, lateral or cross supports,
      wherein at least one of the side, lateral, and cross supports is in the form of an extrusion, the extrusion defining at least one re-entrant channel extending in a direction of its longitudinal axis, the at least one re-entrant channel for receiving at least a portion of a coupler.

2. The console module unit of claim 1 wherein at least one of the at least one brace support is in the form of an extrusion.

3. The console module unit of claim 1 wherein each of the brace support and the two other supports connected by the at least one box frame bracket is in the form of an extrusion defining a re-entrant channel, and the box frame bracket is connected to each of the brace support and the two other supports of the frame by at least one coupler that engages the re-entrant channel of the respective support.

4. The console module unit of claim 3 further comprising at least one lateral brace support having a sheet form, the at least one lateral brace extending between and connected to two opposing side, lateral or cross supports of the frame, the at least one lateral brace contributing to a rigidity of the frame.

5. The console module unit of claim 3 further comprising at least one slat wall panel coupled to the frame.

6. The console module unit of claim 5 wherein the at least one slat wall panel extends between and is coupled to two opposing side, lateral or cross supports of the frame.

7. A modular console system comprising:
   at least a first console module unit and a second console module unit, the first and second console module units each comprising:
   a self-supporting frame, the frame comprising:
      first and second spaced apart frame sections, each frame section comprising two spaced apart side supports and two spaced apart lateral supports, each lateral support disposed between and forming junctions with corresponding ends of the side supports;
      a plurality of cross supports interconnecting the first and second frame sections, wherein there is at least one cross support extending between and joining each of the corresponding junctions of the first and second frame sections, the plurality of cross supports and the first and second frame sections forming the self-supporting frame;
      at least one brace support, the at least one brace support coupled to and extending between two opposing supports of the frame; and
      at least one box frame bracket, the at least one box frame bracket connecting the brace support to two other supports of the frame,
   wherein the frame of the first console module unit is coupleable to the frame of the second console module unit by substantially aligning at least one of the side, lateral, cross or brace supports of the first console module unit with and adjacent to at least one of the side, lateral, cross or brace supports of the second console module unit, and connecting the at least one support of the first console module unit to the at least one support of the second console module unit by one or more couplers.

8. The modular console system of claim 7 wherein the at least one support of the first console module unit and the at least one support of the second console module unit are each in the form of an extrusion, the extrusion defining at least one re-entrant channel extending in a direction of its longitudinal axis, and wherein the at least one support of the first console module unit and the at least one support of the second console module unit are coupled together by at least one coupling assembly.

9. The modular console system of claim 8 wherein at least one of the at least one coupling assembly comprises a bracket and at least first and second fasteners, the first fastener connecting the bracket to the support of the first console module, and the second fastener connecting the bracket to the support of the second console module.

10. The modular console system of claim 9 wherein the first fastener connects the bracket to the at least one support of the first console module by engaging the re-entrant channel of the support of the first console module, and the second fastener connects the bracket to the at least one support of the second console module by engaging the re-entrant channel of the support of the second console module.

11. The modular console system of claim 8 wherein at least one of the at least one coupling assembly is a latch.

12. The modular console system of claim 11 wherein the latch engages at least one of the at least one support of the first and second console module units by engaging the at least one re-entrant channel of the at least one support.

13. The modular console system of claim 12 wherein the latch engages the at least one support of both the first and second console module units by engaging the at least one re-entrant channel of each of the at least one supports.

14. The modular console system of claim 12 wherein the latch is selected from the group consisting of: an over-center draw latch, an under-center draw latch, a cam latch, and a rotary action latch.

15. A modular console system comprising:
at least a first console module unit and a second console module unit, the first and second console module units each comprising:
a self-supporting frame, the frame comprising:
first and second spaced apart frame sections, each frame section comprising two spaced apart side supports and two spaced apart lateral supports, each lateral support disposed between and forming junctions with corresponding ends of the side supports;
a plurality of cross supports interconnecting the first and second frame sections; and
a pair of secondary side supports disposed outwardly and spaced away from a corresponding pair of side supports of the frame sections on a same side of the frame, and each being joined to its corresponding side support by one or more connectors,
wherein the plurality of cross supports, the first and second frame sections, the pair of secondary side supports, and the connectors form the self-supporting frame,
wherein the frame of the first console module unit is coupleable to the frame of the second console module unit by substantially aligning at least one of the side, lateral or cross supports of the first console module unit with and adjacent to at least one of the side, lateral or cross supports of the second console module unit, and connecting the at least one support of the first console module unit to the at least one support of the second console module unit by one or more couplers.

16. The modular console system of claim 15 wherein the at least one support of the first console module unit and the at least one support of the second console module unit are each in the form of an extrusion, the extrusion defining at least one re-entrant channel extending in a direction of its longitudinal axis, and wherein the at least one support of the first console module unit and the at least one support of the second console module unit are coupled together by at least one coupling assembly.

17. The modular console system of claim 15 wherein at least one of the one or more connectors is a box frame bracket.

* * * * *